(12) United States Patent
Goh

(10) Patent No.: US 7,679,450 B2
(45) Date of Patent: Mar. 16, 2010

(54) AMPLIFIER AUTO BIASING

(75) Inventor: Ban Hok Goh, Reservoir View (SG)

(73) Assignee: Infineon Technologies AG, Neubiberg (DE)

(*) Notice: Subject to any disclaimer, the term of this patent is extended or adjusted under 35 U.S.C. 154(b) by 62 days.

(21) Appl. No.: 12/031,041

(22) Filed: Feb. 14, 2008

(65) Prior Publication Data
US 2009/0206934 A1 Aug. 20, 2009

(51) Int. Cl.
*H03F 1/14* (2006.01)
(52) U.S. Cl. ............................. 330/290; 330/292
(58) Field of Classification Search .......... 330/279, 330/292, 307, 290, 296
See application file for complete search history.

(56) References Cited

U.S. PATENT DOCUMENTS

| 6,563,377 B2* | 5/2003 | Butler ......................... 330/10 |
| 6,990,323 B2* | 1/2006 | Prikhodko et al. .......... 455/126 |
| 7,486,143 B2* | 2/2009 | Sun Wei et al. ............. 330/296 |

FOREIGN PATENT DOCUMENTS

| DE | 4142299 A1 | 7/1993 |
| GB | 2410142 A  | 7/2005 |

* cited by examiner

*Primary Examiner*—Steven J Mottola
(74) *Attorney, Agent, or Firm*—Lee & Hayes, PLLC

(57) ABSTRACT

This disclosure relates to monitoring signal overshoot of an amplifier generated signal and automatically adjusting a quiescent current of the amplifier as a function of the monitored signal overshoot.

23 Claims, 5 Drawing Sheets

AMPLIFIER AUTO BIASING

BACKGROUND

This application relates to maintaining automatically biasing an amplifier, and more specifically to automatically tuning the current of the amplifier so that the amplifier will operate at an optimized mode.

Amplifiers are designed using several operating classes including those known as Class A, Class B, Class AB, and Class G. Each of these classes addresses one or more particular aspects of desired amplifier behavior but all of them have constraints or tradeoffs that are substantially unavoidable.

Ethernet physical layer normally employs class AB amplifier at the output stage. However, class AB might not be the best deployment as it normally has higher distortion as compared to class A. Although class AB tends to have better efficiency.

Due to the wire bonding, packaging and cable length, the output pins of the amplifier might see some stray inductance. The value of the stray inductance would be higher if the amplifier's bonded wire is long, if the amplifier packaging is large or if the amplifier is driving a long cable.

When the inductance is high, a pure class AB amplifier might distort signals with a large overshoot or undershoot. This impairment can cause signal integrity issue. The result is more packets loss over the signal line, especially when the cable is long. When the stray inductance is high, operating the amplifier at or near class A could improve the amplifiers signal integrity as class A has much better signal quality at the expense of poorer efficiency. Operating at class A reduces high overshoot/undershoot when the inductance is high. However, class A amplifiers can easily be overloaded by unusual and excessive output loads. Operating the amplifier at class B can result in a generated crossover distortion as the amplifiers output signal changes its polarity.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques to automatically tune the quiescent current of an amplifier. In this way, optimized operation class mode could be obtained depending on the stray inductance value on one of the amplifiers output leads. Depending on the stray inductance, the amplifier could be automatically adjusted to operate somewhere between pure class A to pure class B. The quiescent current of the amplifier will be automatically adjusted to counteract the introduced unwanted stray inductance. Thus, the disclosed techniques will improve the signal integrity and optimize the overall efficiency.

In one described implementation, a system is shown that includes a signal amplifier having a quiescent current used to generate an amplified signal. The system includes a comparator that is located in an integrated circuit and that has a circuit pin. The comparator receives the amplified signal on the circuit pin. The comparator provides an indication when the level of an overshoot of an amplifier generated signal resulting from inductance of the circuit pin exceeds a threshold level. A control circuit adjusts the quiescent current of the amplifier as a function of the peak level the amplified generated signal on the integrated circuit pin exceeds a threshold level.

According to another implementation, a method is provided for monitoring signal overshoot of an amplifier generated signal resulting from inductance on an integrated circuit pin. The signal overshoot is reduced by adjusting a quiescent current of the amplifier as a function of the monitored signal overshoot.

The techniques described herein may be implemented in a number of ways. One example environment and context is provided below with reference to the included figures and on going discussion.

Figure 1:
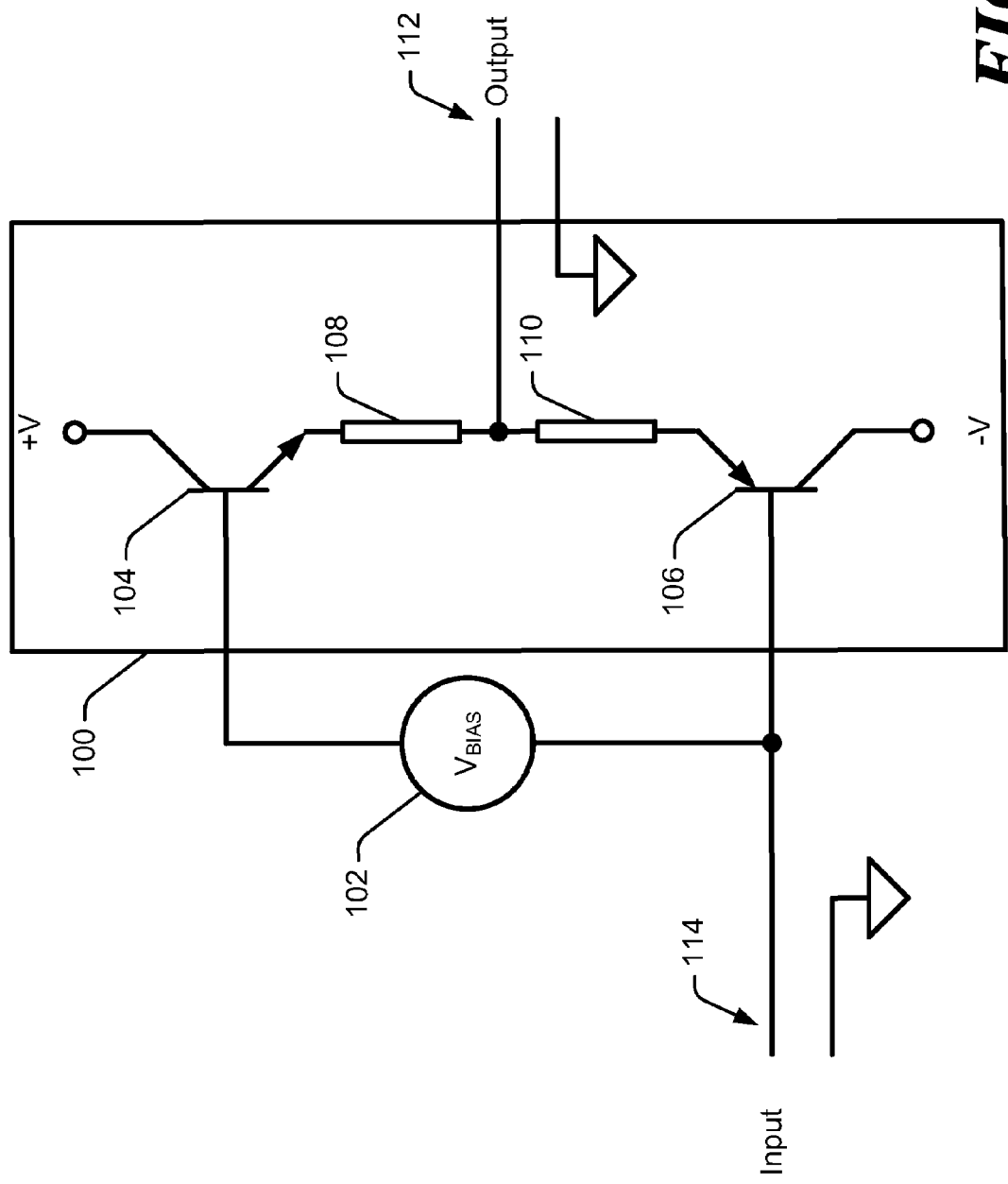
FIG. 1 is simplified schematic diagram of an exemplary push-pull amplifier having its current controlled by a Voltage Bias Circuit.

FIG. 1 shows an exemplary push-pull amplifier 100 being regulated by $V_{BIAS}$ circuit 102 that could be used with the claimed invention. Amplifier 100 includes transistor 104 and transistor 106 respectively coupled via resistors 108 and 110 to output terminal 112. Transistor 104 has a gate terminal regulated by $V_{BIAS}$ circuit 102 (also referred to herein as a voltage bias circuit). $V_{BIAS}$ circuit 102 is coupled to input terminal 114 and the gate of transistor 106. A source terminal of transistor 104 is coupled to a positive reference voltage (+V) and the source terminal of transistor 106 is coupled to a negative reference voltage (−V).

During operation of amplifier 100, an input signal is received on input terminal 114. The voltage level of the input signal is fed via the $V_{BIAS}$ circuit 102 to regulate the current through transistor 104, and fed directly to transistor 106 to regulate current through transistor 106. Transistor 104 and transistor 106 combine with resistors 108 and 110 to amplify the input signal and transfer the amplified input signal to output terminal 112.

Exemplary Systems

Figure 2:
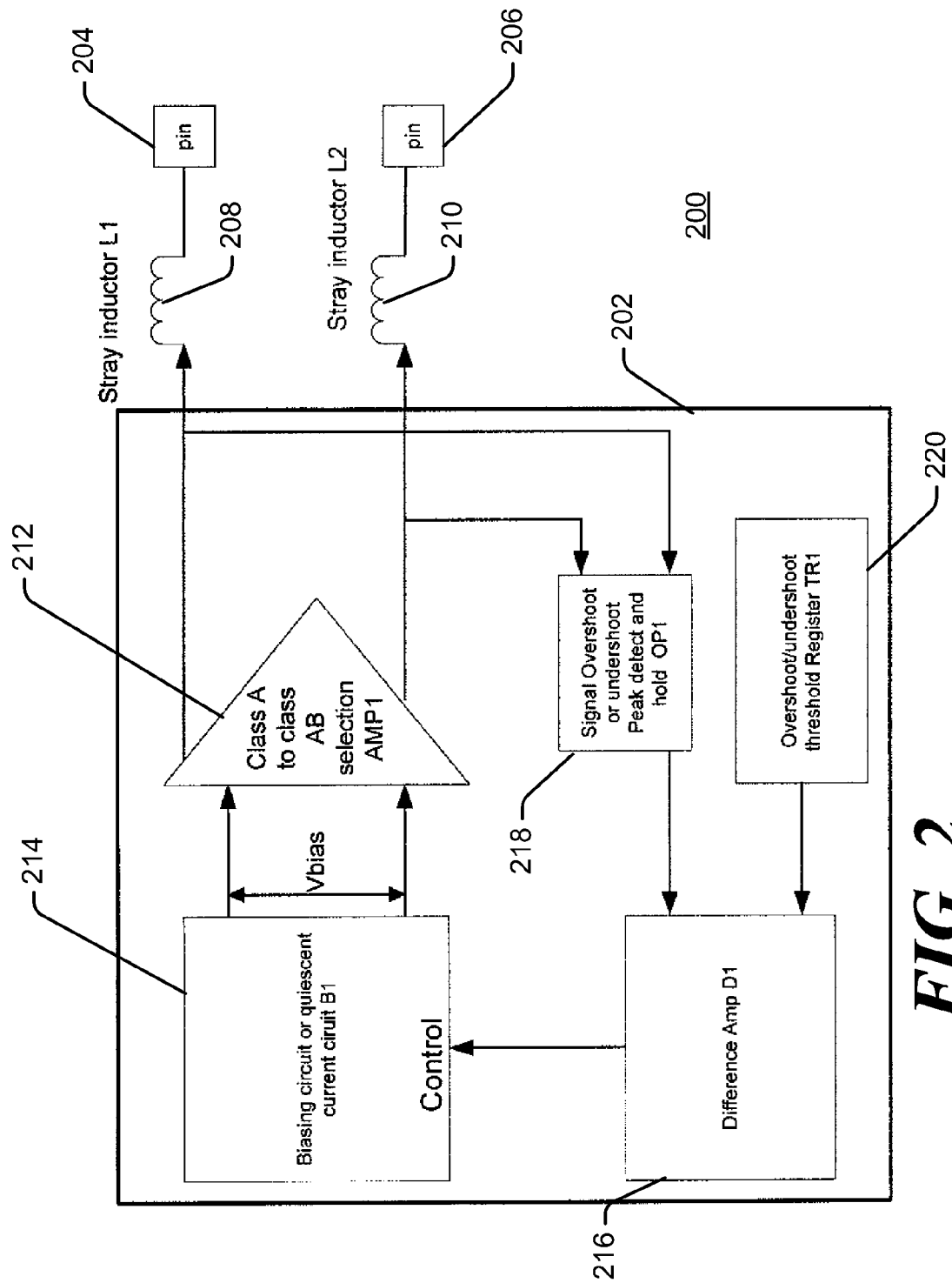
FIG. 2 is block diagram of system having its amplifier controlled by a biasing circuit.

FIG. 2 illustrates one implementation of automatic bias amplifier system 200. Amplifier system 200 includes automatic biased amplifier 202 that is disposed on an integrated circuit and is connected to output pins 204 and 206. Pins 204 and 206 (and the lead wires fed thereto) have an inductance that is illustrated as stray inductors 208 and 210 respectively.

Automatic biased amplifier 202 includes amplifier circuit 212, a voltage biasing circuit 214 (also referred to herein as quiescent current circuit), a difference amplifier 216 (also referred to herein as a detection circuit), a signal overshoot or undershoot peak detection circuit 218 and an overshoot/undershoot threshold register circuit 220. Amplifier circuit 212 is connected to and biased by biasing circuit 214. One such implementation of an amplifier circuit 212 is disclosed in FIG. 1. In another implementation, amplifier circuit 212 may be an Ethernet amplifier having its class and/or mode set adjusting its quiescent current.

The output of amplifier circuit 212 is connected to pins 204 and 206. Peak hold and detection circuit 218 is connected to pins 204 and 206 and the output of amplifier circuit 212. Detection circuit 218 monitors signal overshoot and undershoot on pins 204 and 206 caused by inductance on stray inductors 208 and 210 and quantifies the level of the overshoot. Overshoot/undershoot threshold register circuit 220 is preset with a value corresponding to the peak level of the desired overshoot resulting from inductors 208 and 210.

The output of register circuit 220 and detection circuit 218 is fed to difference amplifier detection circuit 216. Detection circuit 216 compares the output from detect circuit with the output from register circuit 220 and generates a control signal corresponding to the difference between the outputs. This control signal is then fed to biasing circuit 214.

Biasing circuit 214, in response to the control signal, sets a $V_{BIAS}$ voltage and changes the bias current of amplifier circuit 212 in response to the control signal. In one implementation, the biasing circuit 214 may generate a quiescent current to set the class of the amplifier circuit 212 in response to the control signal. For example, if the control signal indicates a substantial difference between the peak level of the detected overshoot/undershoot from detection circuit 218 and the output level (also referred to as a threshold level) from register circuit 220, the quiescent current of the amplifier circuit 212 may be set at or close to an A class. However, if the differences between the detected peak level of the overshoot/undershoot from detection circuit 218 and the output level from register circuit 220 is minimal or is less than a predetermined threshold level, the quiescent current of amplifier circuit 212 may be set to the B class.

Specifically, by changing the $V_{BIAS}$ voltage, biasing circuit 212 will control the quiescent current of amplifier circuit 212 that will effectively set the amplifier circuit 212 to the appropriate class. When the quiescent current is large due to larger stray inductance, it will put the amplifier circuit 212 more towards the A class. Biasing more towards A class could offer good signal performance and hence reduce the overshoot of the signal. In reverse, when the quiescent current is low due to low stray inductance, amplifier circuit 214 will be set more towards B class since the overshoot is low or negligible. This optimizes the power efficiency. As this system 200 is a closed loop, system 200 enables an accurate detection of the overshoot voltage level. Further the biasing quiescent current is changed to put the amplifier 212 into proper class in order to remove the overshoot voltage on the fly and improve the signal integrity from amplifier circuit 212.

Figure 3:
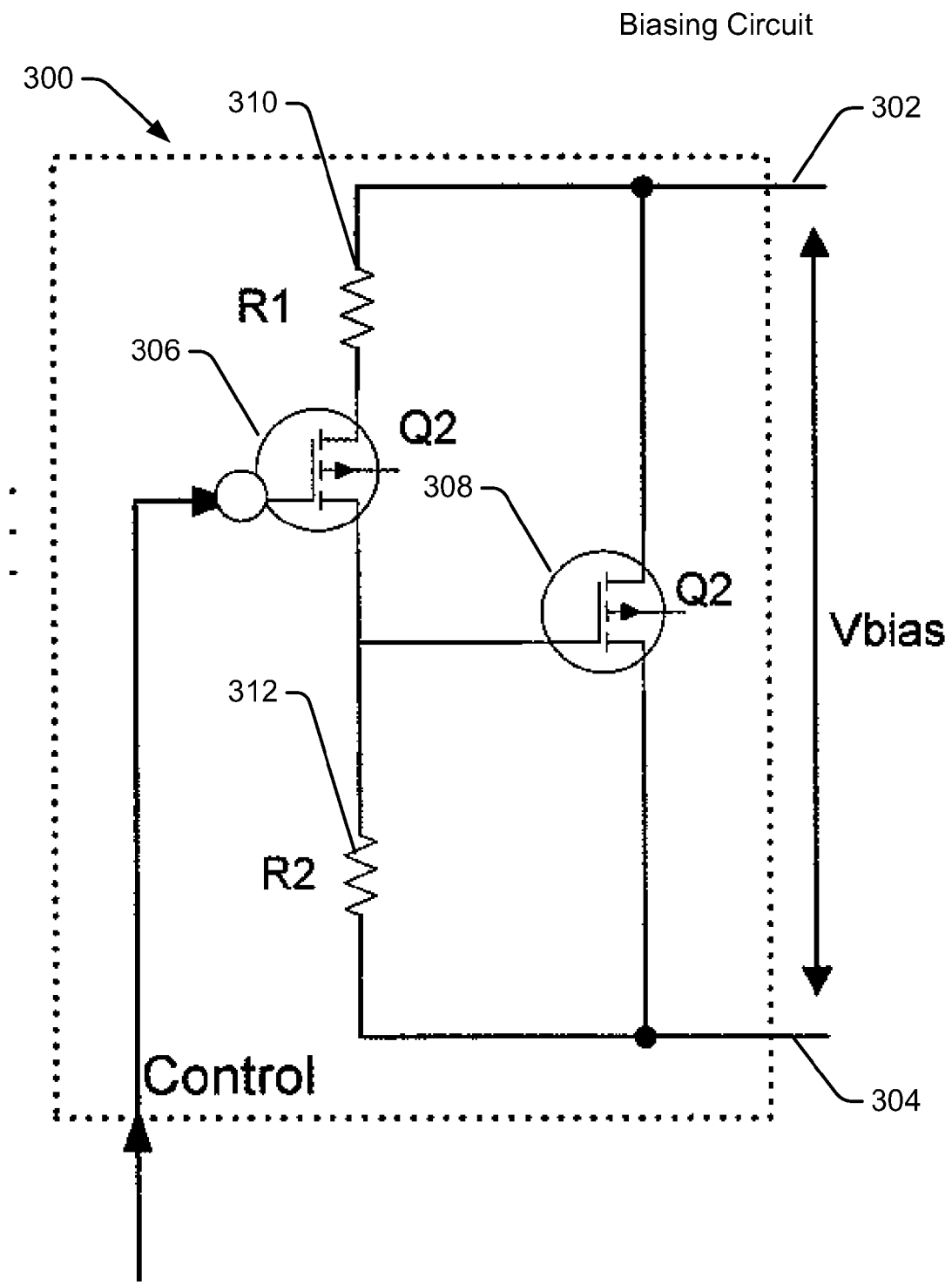
FIG. 3 is a schematic diagram of the biasing circuit shown in FIG. 2.

Shown in FIG. 3 is a schematic diagram of the biasing circuit 300 (biasing circuit 214 in FIG. 2). Biasing circuit 300 includes output terminals 302 and 304 and includes transistors 306 and 308. The gate of transistor 306 is coupled to the output of detection circuit 216 (FIG. 2) and receives the control signal from detection circuit 216. The source terminal of transistor 306 is connected via resistor 310 to output terminal 302. The drain terminal of transistor 306 is connected to the gate terminal of transistor 308 and is connected via resistor 312 to output terminal 304. The source and drain terminal of transistor 308 are respectively connected to output terminals 302 and 304. The control signal drives transistors 306 and 308, to set the $V_{BIAS}$ voltage level between output terminal 302 and output terminal 304.

Figure 4:
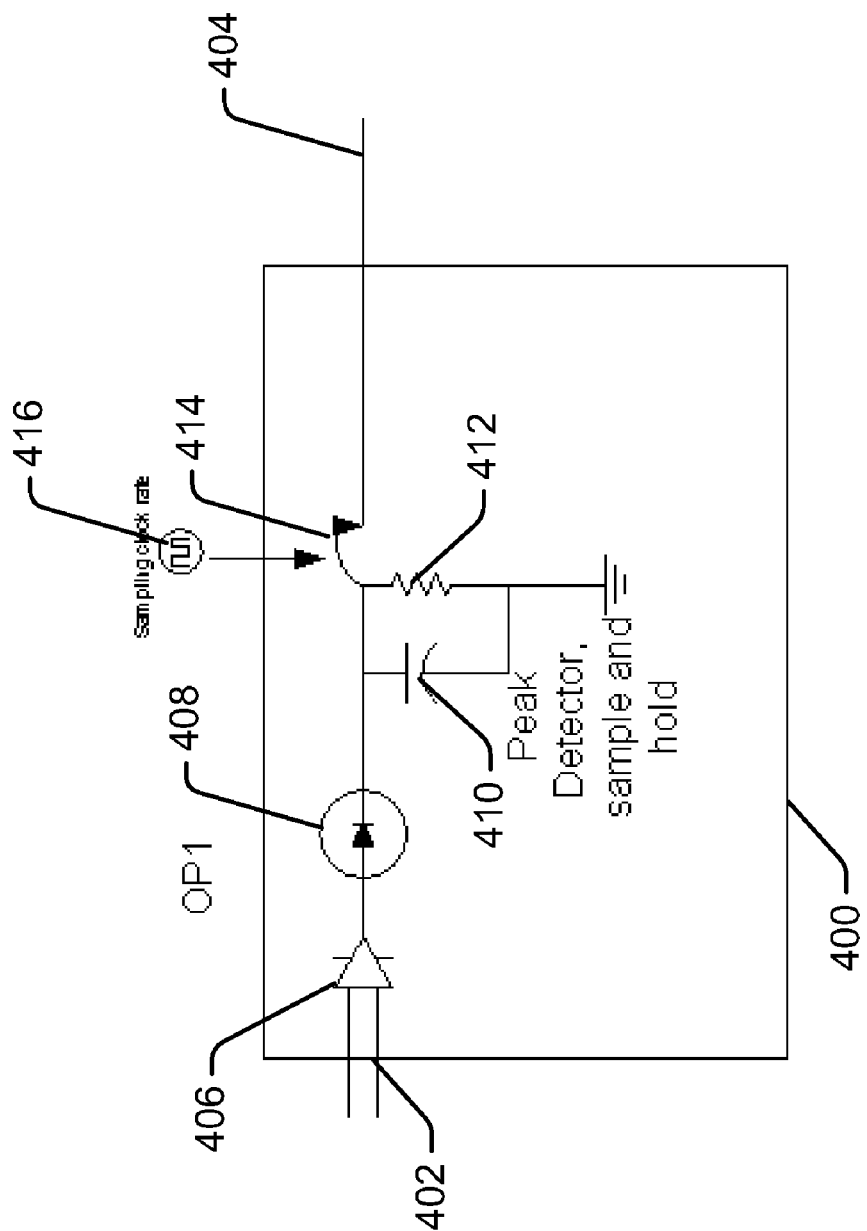
FIG. 4 is a schematic diagram of the peak detection, sample and detection circuit shown in FIG. 2.

Illustrated in FIG. 4 is sample and hold detection circuit 400 (designated as detection circuit 218 in FIG. 2) that detects a peak level of the overshoot and undershoot on pins 204 and 206. Detection circuit 400 includes an input terminal 402 and output terminal 404. Detection circuit 400 also includes a receiver 406 coupled to input terminal 402. The output of the receiver 406 is connected to an input of diode 408. The output of diode 408 is connected to a capacitor 410 and resistor 412. Capacitor 410 is shunt to ground in parallel with resistor 412. The output of diode 408 is connected to an input of sample circuit 414. Sample circuit 414 receives a clock signal 416 from a clock source (not shown). Sample circuit 414 holds the peak level of the signal from diode 408 for at least one clock cycle. The output of sample circuit 414 is connected to output terminal 404. The output signal on output terminal 404 from sample circuit 414 is fed to detection circuit 216 (FIG. 2).

During operation an overshoot/undershoot signal that indicates the voltage levels of undershoot or overshoot on pins 204 and 206 resulting from an inductance of inductors 208 and 210. The overshoot/undershoot signal is received and buffered by receiver 406. The voltage level of the buffered signal is held by diode 408, capacitor 410 and resistor 412 and supplied to sample circuit 414. Sample circuit 414 holds the peak level of the held signal for at least one cycle of clock signal 416.

Although the automatically biasing amplifier 202 is shown having one amplifier circuit 212, this implementation is meant to serve only as a non-limiting example and many amplifier circuits may be used with one or more biasing circuits. Further the amplifier shown in FIG. 1 is only one example of an amplifier and many other amplifier types may be used as the amplifier circuit 212.

Exemplary Process

Figure 5:
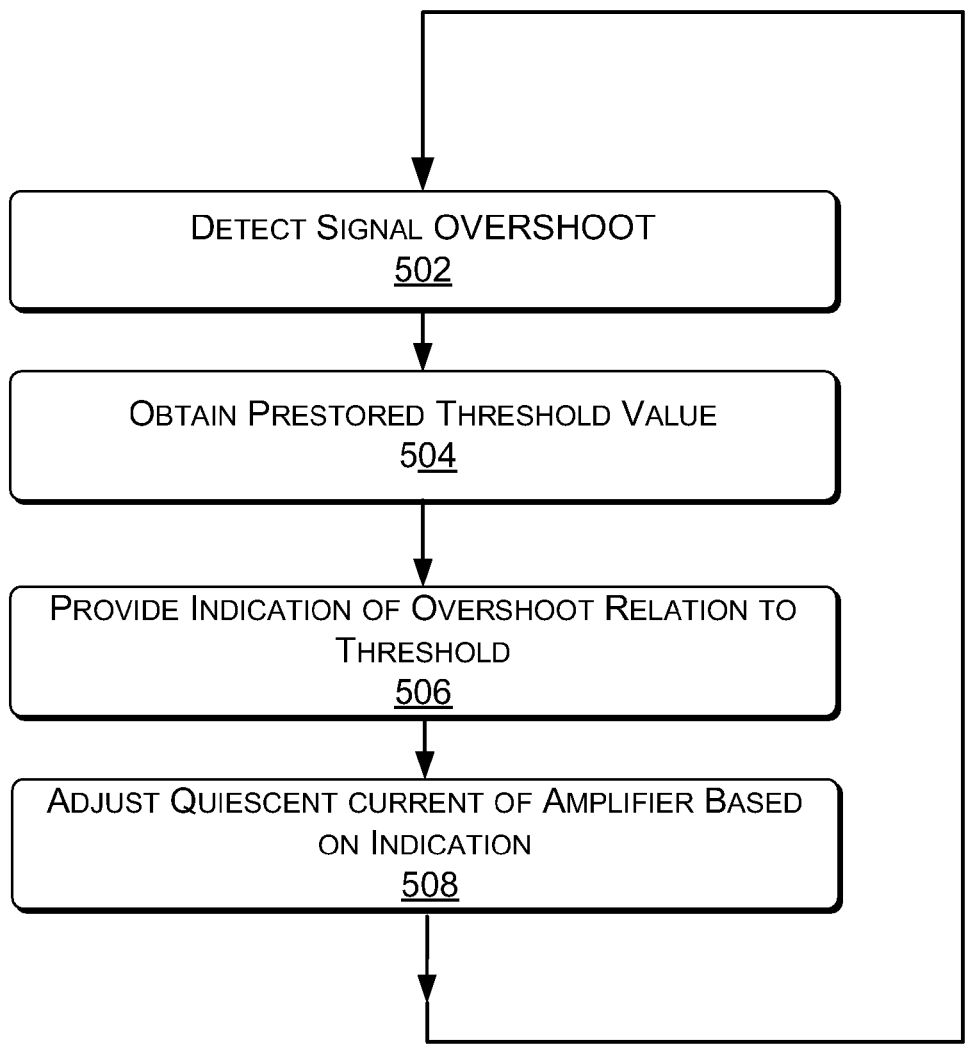
FIG. 5 is a flow diagram of a process for automatically biasing an amplifier using the system shown in FIG. 2.

FIG. 5 shows one example implementation of a process 500 for automatically biasing a voltage level or quiescent current provided to an amplifier. The system in FIG. 2 may be used for reference in describing one aspect of providing automatic biasing of the quiescent current supplied to an amplifier.

Specifics of exemplary methods are described below. However, it should be understood that certain acts need not be performed in the order described, and may be modified, and/or may be omitted entirely, depending on the circumstances. Moreover, the acts described may be implemented by a computer, hardware circuit, processor or other computing device based on instructions stored on one or more computer-readable media. The computer-readable media can be any available media that can be accessed by a computing device to implement the instructions stored thereon.

In the process 500 at block 502, detection circuit 218 detects a peak voltage level of signal overshoot and undershoot from amplifier 212 on pins 204 and 206 resulting from stray inductor 208 and 210. Detection circuit 218 supplies a signal corresponding to this peak voltage level. At block 504 a pre-stored threshold level is stored in register circuit 220. Register circuit 220 supplies the threshold level as a signal to difference amplifier 216. At block 506, difference amplifier 216 determines the difference in voltage levels between the signal from detection circuit 218 and the signal from register circuit 220, and provides an indication of the difference to biasing circuit 214. At block 508, biasing circuit 214 automatically adjusts the quiescent current or bias voltage to amplifier circuit 212 based on the indication.

In one implementation, biasing circuit 214 adjusts the quiescent current to amplifier circuit 212 to change the class of amplifier 212. The process then repeats in block 502 by re-detecting the peak voltage level of signal overshoot in block 502. By continuously detecting the peak voltage level of overshoot and responding to the overshoot by automatically changing the quiescent current of amplifier circuit 212, the output of the amplifier system 200 can change with changes to the environment of the amplifier system 200. Further the amplifier circuit 212 will operate at an optimized class which has the best signal integrity with either no overshoot or a predefined overshoot.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
    a signal amplifier to generate an amplified signal, said signal amplifier having a quiescent current;
    a comparator disposed in an integrated circuit and including a circuit pin, said comparator to continuously receive the amplified signal via the circuit pin and to provide an indication when a level of an overshoot of the amplified signal, resulting from an inductance of the integrated circuit pin, exceeds a threshold level; and
    a control circuit to automatically adjust the quiescent current of the signal amplifier as a function of the level of the overshoot of the amplified signal that exceeds a threshold level.

2. A system as recited in claim 1, further comprising a threshold generator to provide the threshold level, and wherein the comparator provides the indication when the level of the overshoot exceeds the threshold level.

3. A system as recited in claim 1, wherein the amplifier is an Ethernet AB amplifier, and wherein the control circuit provides the quiescent current to select an Ethernet A amplifier when the level of overshoot exceeds the threshold level and to select an Ethernet B class when the level of the overshoot is less than the threshold level.

4. A system as recited in claim 1, wherein the indication is continuously provided by the comparator, and wherein the control circuit automatically adjusts the quiescent current of the amplifier in response to the indication.

5. A system as recited in claim 1, wherein the comparator is operative to indicate the amount that a peak level of the overshoot exceeds the threshold level.

6. A system as recited in claim 1, wherein the comparator includes a peak detection circuit that detects and holds for a predetermined time period a peak level of the overshoot.

7. A system as recited in claim 6, further comprising a threshold generator to provide the threshold level, and wherein the comparator compares a peak level of the overshoot with the threshold level, and generates a peak signal indicating a magnitude that the peak level exceeds the threshold level.

8. A system as recited in claim 7, wherein the control circuit responds to the peak signal by adjusting the quiescent current of the amplifier as a function of the magnitude that the peak level exceeds the threshold level.

9. In a signal amplifier disposed in an integrated circuit including a circuit pin and a quiescent current, a device comprising:
    a comparator to receive an amplified signal generated by the signal amplifier, the comparator to provide an indication of a magnitude of a level of an overshoot of the amplified signal resulting from inductance of the integrated circuit pin; and
    a control circuit to adjust a class of the signal amplifier as a function of the indicated magnitude.

10. A device as recited in claim 9, wherein the amplifier is an Ethernet AB amplifier having an Ethernet A class and an Ethernet B class, and wherein the control circuit provides a signal to the amplifier to:
    select an Ethernet A class when the value of the level of the overshoot exceeds the threshold level, and
    select an Ethernet B class when the value of the level of overshoot is below the threshold level.

11. A device as recited in claim 9, further comprising a threshold generator circuit to provide a threshold level, and wherein the comparator provides the indication when the level of the overshoot exceeds the threshold level.

12. A device as recited in claim 9, wherein the control circuit adjusts the class of the signal amplifier by adjusting a quiescent current of the signal amplifier.

13. A device as recited in claim 9, wherein the comparator provides an indication of a magnitude of a peak level of the overshoot of the amplified signal.

14. A method comprising:
    continuously monitoring signal overshoot of an amplifier generated signal resulting from inductance of an integrated circuit pin of a signal amplifier; and
    automatically reducing the signal overshoot by adjusting a quiescent current of the signal amplifier as a function of the monitored signal overshoot.

15. A method as recited in claim 14, wherein the signal overshoot is continuously monitored and the quiescent current is automatically adjusted.

16. A method as recited in claim 14, wherein the signal amplifier is an Ethernet class AB amplifier, and wherein the method further comprises operating the signal amplifier at class A when a level of the overshoot exceeding a predetermined threshold level is detected and at class B when a level of overshoot below the predetermined threshold is detected.

17. A method as recited in claim 14, wherein monitoring includes detecting a peak level for the signal overshoot.

18. A method as recited in claim 14, further comprising wherein the monitoring further comprises:
    comparing the detected peak level against a threshold level corresponding to a threshold value stored in a threshold register; and
    providing an indication when the peak level exceeds the threshold level.

19. A method as recited in claim 18, wherein the providing the indication further comprises indicating the amount that the peak level exceeds the threshold level.

20. A method as recited in claim 19, wherein reducing further comprises biasing the current of the amplifier an amount proportional to the amount the peak level exceeds the threshold level.

21. A system comprising:
    a signal amplifier to generate an amplified signal, said signal amplifier having a quiescent current;
    a comparator disposed in an integrated circuit and including a circuit pin, said comparator to continuously receive the amplified signal via the circuit pin and to provide an indication when a level of an overshoot of the amplified signal, resulting from an inductance of the integrated circuit pin, exceeds a threshold level;
    a control circuit to automatically adjust the quiescent current of the signal amplifier as a function of the level of the overshoot of the amplified signal that exceeds a threshold level; and
    wherein the signal amplifier is an AB amplifier and the control circuit provides a signal to the signal amplifier to configure the signal amplifier to operate as an A class amplifier when the level of the overshoot exceeds the threshold level and to configure the signal amplifier to operate as a B class amplifier when the level of the overshoot is less than the threshold level.

22. In a signal amplifier disposed in an integrated circuit including a circuit pin and a quiescent current, a device comprising:

a comparator to receive an amplified signal generated by the signal amplifier, the comparator to provide an indication of a magnitude of a level of an overshoot of the amplified signal resulting from inductance of the integrated circuit pin;

a control circuit to adjust a class of the signal amplifier as a function of the indicated magnitude; and wherein the signal amplifier is an AB amplifier having an A class and a B class, and wherein the control circuit provides a signal to the signal amplifier to:

select an A class when the value of the level of the overshoot exceeds the threshold level, and select a B class when the value of the level of the overshoot is below the threshold level.

23. A method comprising:

continuously monitoring signal overshoot of an amplifier generated signal resulting from inductance of an integrated circuit pin of a signal amplifier;

automatically reducing the signal overshoot by adjusting a quiescent current of the signal amplifier as a function of the monitored signal overshoot; and wherein the signal amplifier is a class AB amplifier, operating the signal amplifier at class A when a level of the overshoot exceeding a predetermined threshold level is detected and operating the signal amplifier at class B when a level of overshoot below the predetermined threshold level is detected.

* * * * *